United States Patent [19]
Chung

[11] Patent Number: 6,037,253
[45] Date of Patent: Mar. 14, 2000

[54] METHOD FOR INCREASING INTERCONNECT PACKING DENSITY IN INTEGRATED CIRCUITS

[75] Inventor: Henry Chung, Singapore, Singapore

[73] Assignee: Chartered Semiconductor Manufacturing Company, Ltd., Singapore, Singapore

[21] Appl. No.: 08/789,719

[22] Filed: Jan. 27, 1997

[51] Int. Cl.$^7$ .............................................. H01L 21/4763
[52] U.S. Cl. .......................... 438/639; 438/637; 438/626; 438/631; 438/625; 438/629; 438/633; 438/648
[58] Field of Search ..................................... 438/624, 622, 438/631, 625, 618, 626, 635, 639, 642, 652, 637, 672, 675

[56] References Cited

U.S. PATENT DOCUMENTS

| | | | |
|---|---|---|---|
| 5,100,838 | 3/1992 | Dennison | 438/586 |
| 5,407,532 | 4/1995 | Fang et al. | 438/637 |
| 5,444,015 | 8/1995 | Aitken et al. | |
| 5,466,640 | 11/1995 | Choi | |
| 5,516,726 | 5/1996 | Kim et al. | |

Primary Examiner—Charles Bowers
Assistant Examiner—Hsien Ming Lee
Attorney, Agent, or Firm—George O. Saile; Rosemary L.S. Pike; William J. Stoffel

[57] ABSTRACT

The present invention provides a method of forming closely spaced interconnections over a semiconductor structure using conventional photolithographic and etching methods and tools. The process which begins by providing an insulating layer 14 over a semiconductor structure 10. A conductive layer and an isolation layer are sequentially formed over the insulating layer 14. The conductive layer is patterned forming spaced first interconnects 16 covered by isolation layer blocks 20. Sidewall spacers are then formed on the sidewalls of the first interconnects and the isolation layer blocks 20. A second conductive layer is formed over the resulting surface. The second conductive layer is planarized forming second interconnects 30 and excess conductive pieces 31 between the sidewall spacers. The excess conductive pieces 31 are intended to be removed. The planarization of the second conductive layer can be performed by etching back the second conductive layer or by chemical-mechanical polishing (CMP) back the second conductive layer. The excess conductive pieces 31 are removed using a photo/etch process leaving closely spaced first and second interconnects 16 30.

18 Claims, 3 Drawing Sheets

METHOD FOR INCREASING INTERCONNECT PACKING DENSITY IN INTEGRATED CIRCUITS

BACKGROUND OF INVENTION

1) Field of the Invention

This invention relates generally to the fabrication of high density semiconductor circuits and more particularly to a method for fabricating interconnections and conductors (e.g., wiring lines) for high density integrated circuits.

2) Description of the Prior Art

Semiconductor technologies have dramatically increased the circuit density on a chip. The miniaturized devices built in and on a semiconductor substrate are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitations due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOS-FET) and a single capacitor are used extensively in the electronic industry for storing data. A single DRAM cell stores a bit of data on the capacitor as electrical charge. metallization in contact with the semiconductor substrate is called contact metallization. In MOS devices, polysilicon film and metal silicides have been the form of metallization used for gate and interconnection of MOS devices. Interconnection metallization, which interconnects thousands of MOSFET's or bipolar devices using fine line metal patterns, is generally the same as gate metallization.

The inability to further miniaturize the contact metallization and first level interconnections is a major obstacle in the miniaturization of DRAMs and other devices, such as MOS and Bipolar devices. The interconnect packing density in integrated circuits is limited by printing resolution and etching capability. Significant increase in the packing density requires more advanced costly stepper and plasma etcher equipment. Thus, the problems forming smaller first level contacts and first level interconnections must be solved to achieve higher packing density in a semiconductor memory devices.

U.S. Pat. No. 5,516,726 (Kim) shows conventional methods of forming metal layers and interconnects. U.S. Pat. No. 5,466,640 (Choi) shows a method of forming a plurality of metal lines densely packed using two photo masks. U.S. Pat. No. 5,444,015 (Aiken et al.) shows a method of forming interconnects by selective deposition of metal in insulating vias.

However, many of the prior art methods require substantially more processing steps or/and planar structures which make the manufacturing process more complex and costly. Also, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and also provide methods that do not require etches with critical depths.

There is a challenge to develop methods of manufacturing these interconnects and conductors that minimize the manufacturing costs and maximize the device yields. There is also a challenge to develop an interconnection process in which the interconnect size is not limited in size by the photolithographic techniques. In particular, there is a challenge to develop a method of forming more closely packed interconnects using conventional photolithography and etching equipment.

SUMMARY OF THE INVENTION

It is an object of the present invention to provide a method for fabricating more closely packed interconnects using the present generation of photolithography and etching equipment.

It is an object of the present invention to provide a method for fabricating interconnects that are smaller than the photolithographic and etching dimensional limits.

To accomplish the above objectives, the present invention provides a method of forming closely spaced interconnections (e.g., wiring lines) over a semiconductor structure using conventional photolithographic and etching methods and tools. The goals are achieved by the process which begins by providing an insulating layer 14 over a semiconductor structure 10. A conductive layer and an isolation layer are sequentially formed over the insulating layer 14. The conductive layer is patterned forming spaced first interconnects 16 covered by isolation layer blocks 20. Sidewall spacers are then formed on the sidewalls of the first interconnects and the isolation layer blocks 20. A second conductive layer is formed over the resulting surface. The second conductive layer is planarized forming second interconnects 30 and excess conductive pieces 31 between the sidewall spacers. The excess conductive pieces 31 are intended to be removed. The planarization of the second conductive layer can be performed by etching back the second conductive layer or by chemical-mechanical polishing (CMP) back the second conductive layer. A first photoresist layer 34 is formed over the resulting surface. The first photoresist layer 34 has first openings 36 over excess conductive pieces 31. The excess conductive pieces 31 are etched using the first photoresist layer 34 as an etch mask removing the excess conductive pieces 31 and leaving the closely spaced first and second interconnects 16 30. The a final photoresist layer 34 is removed. This process can be repeated to form additional interconnect levels of closely spaced interconnects over lower interconnect levels.

The present invention provides a method of forming closely spaced interconnections 16 30 over a semiconductor structure using conventional photolithographic and etching methods and tools. The sidewall spacer 22 process of the present invention allows interconnects to be formed closer together than possible using conventional photolithographic techniques.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming closely spaced interconnections over a semiconductor structure using conventional photolithographic and etching methods and tools.

Figure 1:
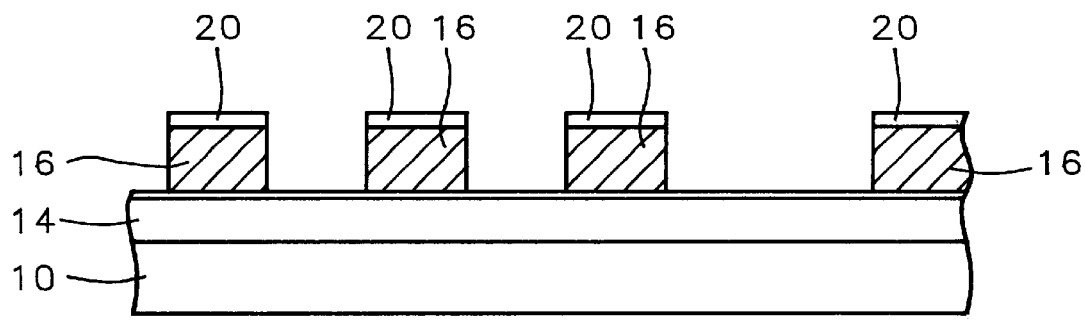
FIGS. 1 through 5 are cross sectional views for illustrating a method for manufacturing a closely spaced interconnections according to the present invention.

As shown in FIG. 1, an insulating layer 14 is provided over a semiconductor structure 10. The semiconductor structure is a general term that is understood to possibly include a semiconductor wafer, active and passive devices formed within the wafer and layers/devices formed on the wafer surface. These devices can include resistors, transistors (bipolar and MOS including source, drain, and gates), etc. The semiconductor wafer is preferably a silicon wafer having a p-type impurity with a (100) crystal orientation.

The insulating layer 14 electrically insulates elements over/in the wafer (e.g., semiconductor structure) and for surface flattening after forming elements such as transistors, etc. on the wafer. The insulating layer 14 is preferably composed of a silicon oxide, borophosphosilicate glass (BPSG), or phosphosilicate glass (PSG), and preferably has thickness in a range of between about 4000 and 20,000 Å.

A conductive layer (not shown) and an isolation layer (not shown) are sequentially formed over the insulating layer 14. The conductive layer is preferably composed of Al, Cu, an Al-alloy or W or combinations thereof and has a thickness in a range of between about 2000 and 15,000 Å.

The isolation layer is preferably composed of a silicon oxide or phosphosilicate glass (PSG) and preferably has a thickness in a range of between about 1000 and 5000 Å. The isolation layer 20 has a significantly lower etch rate or/and chemical-mechanical polish rate—preferably approximately between about 2 and 20 times lower, compared to the conductive layer.

The conductive layer and isolation layer is then patterned using conventional photolithographic processes thereby forming spaced first interconnects 16 (e.g., metal wires, conductive line, etc.) covered by isolation layer blocks 20.

Figure 2:
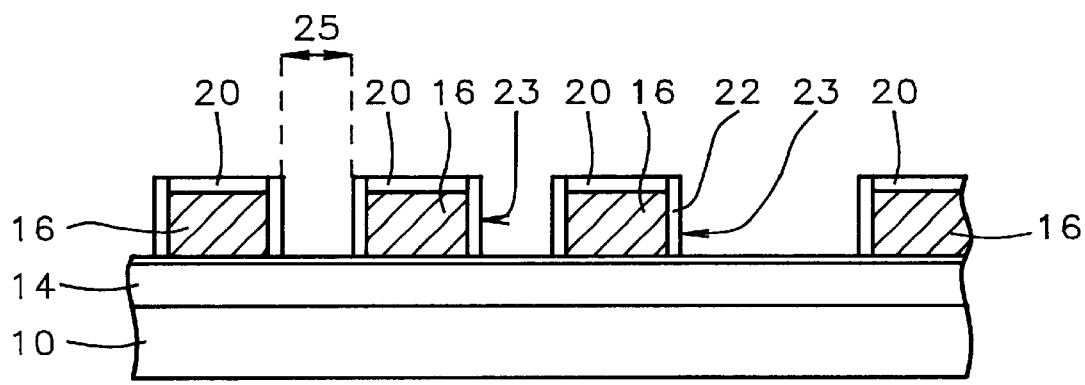

As shown in FIG. 2, sidewall spacers 22 are then formed on the sidewalls of the first interconnects 16 and the isolation layer blocks 20. The sidewall spacers 22 can be formed by conventional methods. The sidewall spacers 22 can be formed by depositing a spacer dielectric layer over the resultant surface and anisotropically etching the spacer dielectric layer. The sidewall spacers 22 preferably have a width in a range of between about 1000 and 5000 Å and composed of silicon oxide, phosphosilicate glass (PSG) or Flourine silicate glass (FSG) material. The sidewall spacers 22 define first openings 23 and second openings 38 between the first interconnects 16. Second interconnects 30 will be formed in the first openings 23. The second openings 38 will be filled in with insulating/planarizing material. The first opening 23 have a width 25 in a range of between about 0.1 and 0.4 μm.

Figure 3:
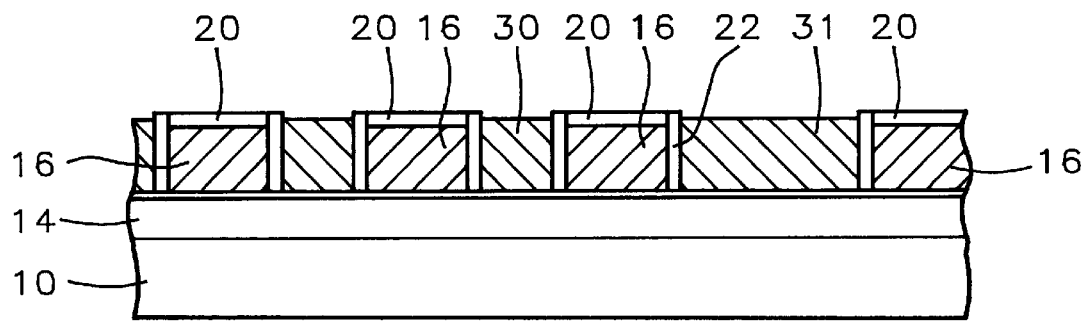

A second conductive layer (not shown) is formed over the resulting surface and fills the first openings 23. The second conductive layer can be formed of the same materials as the first conductive layer/first interconnects 16. As shown in FIG. 3, the second conductive layer is planarized forming second interconnects 30 and excess conductive pieces 31 between the sidewall spacers 22. The excess conductive pieces 31 are intended to be removed. The planarization of the second conductive layer can be performed by etching back the second conductive layer or by chemical-mechanical polishing (CMP) back the second conductive layer. The etch back can be performed using a reactive ion etch using a Cl-based chemistry for Al and Cu and a F-based chemistry for W. The isolation layer blocks 20 are used as etch stops and chemical-mechanical polish stops. The planarization removes the excess of the second conductive layer which extends above the isolation blocks 20.

Figure 4:
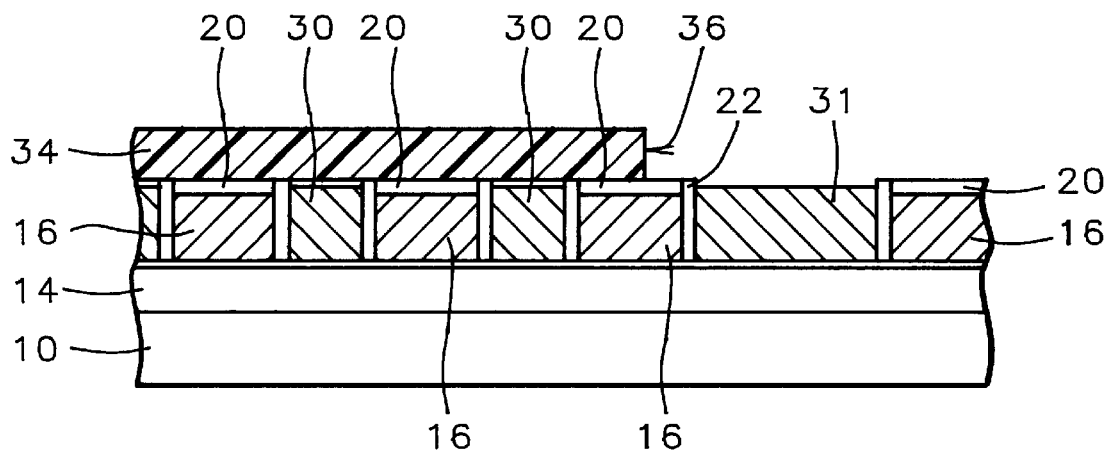

Referring to FIG. 4, a first photoresist layer 34 is formed over the resulting surface. The first photoresist layer 34 has first photoresist openings 36 over the excess conductive pieces 31 which we want to remove. The excess conductive pieces 31 are etched using the first photoresist layer 34 as an etch mask removing the excess conductive pieces 3 1 from said second opening 38 or space 38. The etch leaves the first and second interconnects 16 30. The excess conductive pieces 31 are preferably removed using a plasma etch.

Figure 5:
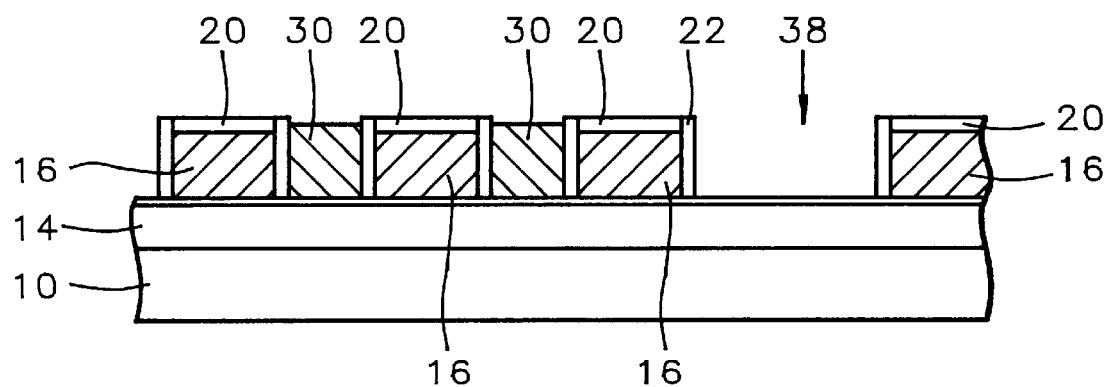

As shown in FIG. 5, the first photoresist layer 34 is removed. The first 16 and second interconnects 30 are very closely spaced. The sidewall spacers 22 electrically insulate adjacent interconnects 16 30 from each other.

Figure 6:
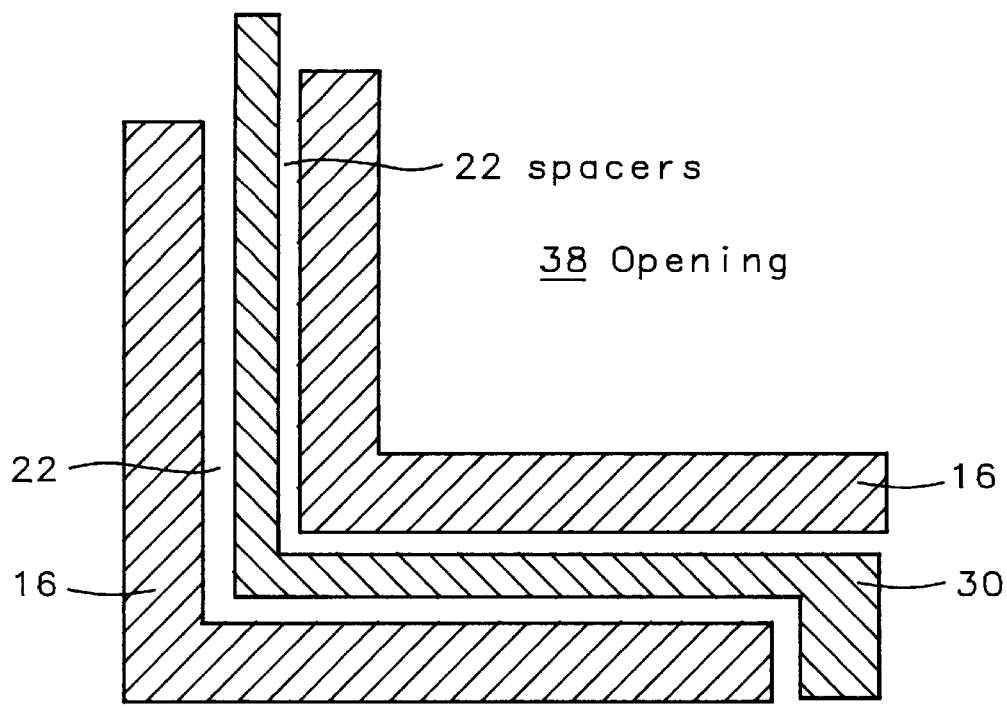
FIG. 6 is a top down view for illustrating a method for manufacturing a closely spaced interconnections according to the present invention.

FIG. 6 shows a top down view of the closely spaced interconnects 16 30 of the present inventions.

Figure 7:
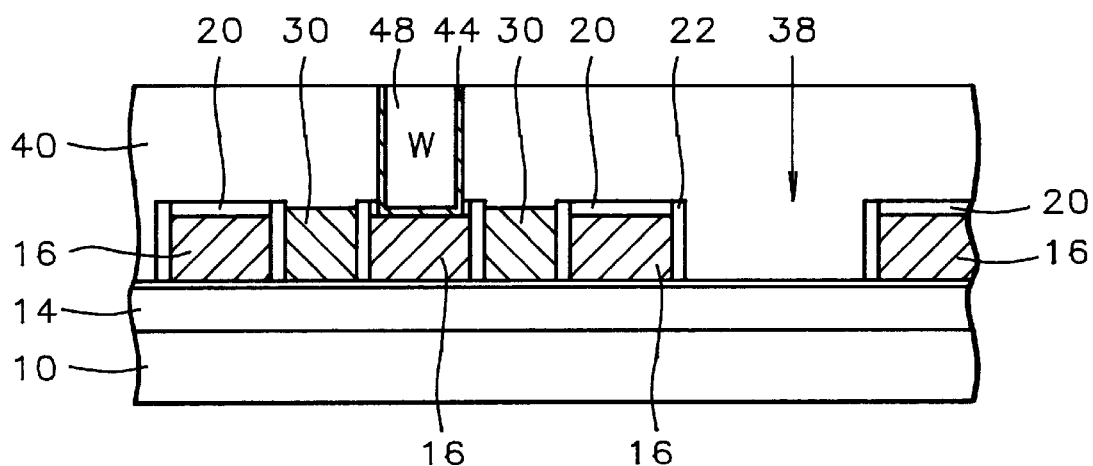
FIG. 7 is a cross sectional view for illustrating a method for manufacturing a closely spaced interconnections according to the present invention.

As shown in FIG. 7, another interconnect layer can be formed over the lower interconnect layer 16 30. A planarization layer 40 is formed over the resultant surface that fills in second opening 38. The planarization layer 40 can be composed of a HDP (high density Plasma) oxide and can be planarized by a chemical-mechanical polishing step.

Next, an interconnect opening is formed in the planarization layer 40 and in the isolation layer 20 over the first or second interconnects 16 30 whichever is desired contact to be made to. An optional adhesion layer 44 is formed in the interconnect opening. The adhesion layer 44 is preferably formed of Ti/TiN. A second level interconnect 48 is formed over the adhesion layer 44. The second level interconnect 48 can be formed of W or of an Al—Cl alloy or other conductive alloys.

Additional levels of closely spaced interconnects (e.g., third and fourth interconnects) can be formed by repeating the same process steps described above.

The present invention provides a method of forming closely spaced interconnections over a semiconductor structure using conventional photolithographic and etching methods and tools. The sidewall spacers 22 process of the present invention allows interconnects to be formed closer together than possible using conventional photolithographic techniques.

It should be will understood by one skilled in the art that by including additional process steps not described in this embodiment, other types of devices can also be included on the semiconductor chip. For example, the conductive interconnect layer can be formed contacting a silicon substrate or contacting a first (or higher) level metal layer. It should also be understood that the figures depict only one section out of a multitude of sections that are fabricated simultaneously on the semiconductor structure.

While the invention has been particularly shown and described with reference to the preferred embodiments thereof, it will be understood by those skilled in the art that various changes in form and details may be made without departing from the spirit and scope of the invention.

What is claimed is:

1. A method of forming closely spaced interconnections over a semiconductor structure comprising:
   a) providing an insulating layer over a semiconductor structure; said semiconductor structure is comprised of a semiconductor wafer having transistors formed thereon; said insulating layer is formed over said transistors;
   b) sequentially forming a conductive layer and an isolation layer over said insulating layer; said isolation layer is composed of silicon oxide or phosphosilicate glass (PSG) and has a chemical-mechanical polish rate between 2 and 20 lower that said conductive layer;
   c) patterning said conductive layer and said isolation layer forming spaced first interconnects covered by isolation layer blocks, said first interconnects and said isolation layer blocks having sidewalls;
   d) forming sidewall spacers on said sidewalls of said first interconnects and said isolation layer blocks, said sidewall spacers defining first openings and second openings therebetween;
   e) forming a second conductive layer over the resulting surface and filling said first and second openings;
   f) planarizing said second conductive layer forming second interconnects in said first openings and excess conductive pieces in said second openings between said sidewall spacers, where said excess conductive pieces are intended to be removed; said second conductive layer is planarized using a chemical-mechanical polish process;
   g) forming a first photoresist layer over said isolation layer blocks and said second interconnects; said first photoresist layer having first photoresist openings over said excess conductive pieces;
   h) etching said excess conductive pieces using said first photoresist layer as an etch mask removing said excess conductive pieces from said second openings and leaving said first and second interconnects; and
   i) removing said first photoresist layer.

2. The method of claim 1 wherein said insulating layer is composed of silicon oxide and has a thickness in a range of between about 4000 and 20,000 Å.

3. The method of claim 1 wherein conductive layer composed of an Al-Alloy and has a thickness in a range of between about 2,000 and 15,000 Å.

4. The method of claim 1 wherein said isolation layer composed of silicon oxide and has a thickness in a range of between about 1000 and 5000 Å.

5. The method of claim 1 wherein said sidewall spacers formed by depositing a spacer dielectric layer over the resultant surface and anisotropically etching said spacer dielectric layer.

6. The method of claim 1 wherein said sidewall spacers have a width in a range of between about 1000 and 5000 Å and composed of a material selected from the group consisting of phosphosilicate glass, silicon oxide and fluorine silicate glass.

7. The method of claim 1 wherein said first openings have a width in a range of between about 0.1 and 0.4 $\mu$m.

8. The method of claim 1 wherein said second conductive layer has thickness in a range of between about 1000 and 5000 Å.

9. The method of claim 1 which further includes forming a planarization layer over said first and second interconnects and filling said second openings; forming an interconnect opening in said planarization layer and in said isolation layer exposing said first interconnects, and forming an interconnect in said interconnect opening.

10. The method of claim 9 which further includes forming third and fourth interconnects over said first and second interconnects by repeating steps (a) through (i).

11. A method of forming closely spaced interconnections over a semiconductor structure comprising:
   a) providing an insulating layer over a semiconductor structure, said semiconductor structure is comprised of a semiconductor wafer having transistors formed thereon; said insulating layer is formed over said transistors;
   b) sequentially forming a conductive layer and an isolation layer over said insulating layer; said conductive layer composed of Al-alloy and has a thickness in a range of between about 2000 and 15,000 Å; said isolation layer is composed of silicon oxide or phosphosilicate glass (PSG) and has a chemical-mechanical polish rate between 2 and 20 times lower that said conductive layer;
   c) patterning said conductive layer and said isolation layer forming spaced first interconnects covered by isolation layer blocks, said first interconnects and said isolation layer blocks having sidewalls;
   d) forming sidewall spacers on said sidewalls of said first interconnects and said isolation layer blocks, said sidewall spacers defining first openings and second openings therebetween, said sidewall spacers formed by depositing a spacer dielectric layer over the resultant surface and anisotropically etching said spacer dielectric layer; said sidewall spacer have a width in a range of between about 1000 and 5000 Å and composed of silicon oxide;
   e) forming a second conductive layer over the substrate surface,
   f) planarizing said second conductive layer forming second interconnects and excess conductive pieces between said sidewall spacers in said second openings, whereby said excess conductive pieces are intended to be removed; said second conductive layer is planarized using a chemical-mechanical polish process;
   g) forming a first photoresist layer over said isolation layer blocks and said second interconnects; said first photoresist layer having first photoresist openings over excess conductive pieces;
   h) etching said excess conductive pieces using said first photoresist layer as an etch mask removing said excess conductive pieces from said second openings and leaving said first and second interconnects; and
   i) removing said a first photoresist layer.

12. The method of claim 11 wherein said insulating layer is composed of silicon oxide and has a thickness in a range of between about 4000 and 20,000 Å.

13. The method of claim 11 wherein said isolation layer composed of silicon oxide and has a thickness in a range of between about 1000 and 5000 Å.

14. The method of claim 11 wherein said first openings have a width in a range of between about 0.1 and 0.4 $\mu$m.

15. The method of claim 11 wherein said second conductive layer has thickness in a range of between about 1000 and 5000 Å.

16. The method of claim 11 which further includes forming a planarization layer over said first and second interconnects and filling said second opening; forming an interconnect opening in said planarization layer and said isolation layer exposing said first interconnect; and forming a interconnect in said interconnect opening.

17. The method of claim 16 which further includes forming third and fourth interconnects over said interconnect by repeating steps (a) through (i).

18. A method of forming closely spaced interconnections over a semiconductor structure comprising:

a) providing an insulating layer over a semiconductor structure, said semiconductor structure is comprised of a semiconductor wafer having transistors formed thereon; said insulating layer is formed over said transistors;

b) sequentially forming a conductive layer and an isolation layer over said insulating layer; said conductive layer composed of Al-alloy and has a thickness in a range of between about 2000 and 15,000 Å; said isolation layer is composed of silicon oxide or phosphosilicate glass (PSG) and has a chemical-mechanical polish rate between 2 and 20 times lower that said conductive layer;

c) patterning said conductive layer and said isolation layer forming spaced first interconnects covered by isolation layer blocks, said first interconnects and said isolation layer blocks having sidewalls;

d) forming sidewall spacers on said sidewalls of said first interconnects and said isolation layer blocks, said sidewall spacers defining first openings and second openings therebetween, said sidewall spacers formed by depositing a spacer dielectric layer over the resultant surface and anisotropically etching said spacer dielectric layer; said sidewall spacer have a width in a range of between about 1000 and 5000 Å and composed of silicon oxide; said first openings have a width in a range of between about 0.1 and 0. 4 Åm;

e) forming a second conductive layer over the substrate surface; said second conductive layer has thickness in a range of between about 1000 and 5000 Å;

f) planarizing said second conductive layer forming second interconnects and excess conductive pieces between said sidewall spacers in said second openings, whereby said excess conductive pieces are intended to be removed; said second conductive layer is planarized using a chemical-mechanical polish process;

g) forming a first photoresist layer over said isolation layer blocks and said second interconnects; said first photoresist layer having first photoresist openings over excess conductive pieces;

h) etching said excess conductive pieces using said first photoresist layer as an etch mask removing said excess conductive pieces from said second openings and leaving said first and second interconnects; and i) removing said a first photoresist layer forming a planarization layer over said first and second interconnects and filling said second opening; forming an interconnect opening in said planarization layer and said isolation layer exposing said first interconnect; and forming a interconnect in said interconnect opening.

* * * * *